(12) United States Patent
Opower

(10) Patent No.: US 8,314,921 B2
(45) Date of Patent: Nov. 20, 2012

(54) EXPOSURE APPARATUS

(75) Inventor: Hans Opower, Krailling (DE)

(73) Assignee: Kleo AG, Appenzell (CH)

( * ) Notice: Subject to any disclaimer, the term of this patent is extended or adjusted under 35 U.S.C. 154(b) by 399 days.

(21) Appl. No.: 12/456,137

(22) Filed: Jun. 10, 2009

(65) Prior Publication Data
US 2009/0296063 A1 Dec. 3, 2009

Related U.S. Application Data

(63) Continuation of application No. PCT/EP2007/010648, filed on Dec. 7, 2007.

(30) Foreign Application Priority Data

Dec. 11, 2006 (DE) .......... 10 2006 059 818

(51) Int. Cl.
G03F 7/22 (2006.01)
(52) U.S. Cl. .......................................... 355/67
(58) Field of Classification Search ............ 355/53, 355/67, 77, 49
See application file for complete search history.

(56) References Cited

U.S. PATENT DOCUMENTS

| | | | |
|---|---|---|---|
| 4,393,387 A | 7/1983 | Kitamura | |
| 4,402,571 A | 9/1983 | Cowan et al. | |
| 4,423,426 A | 12/1983 | Kitamura | |
| 4,440,493 A | 4/1984 | Hiraga | |
| 4,541,712 A | 9/1985 | Whitney | |
| 4,577,926 A | 3/1986 | Dewey et al. | |
| 4,755,724 A | 7/1988 | Wagner | |
| 4,869,999 A | 9/1989 | Fukuda et al. | |
| 4,947,186 A | 8/1990 | Calloway et al. | |
| 5,091,744 A | 2/1992 | Omata | |
| 5,121,256 A | 6/1992 | Corle et al. | |
| 5,143,577 A | 9/1992 | Haas et al. | |
| 5,208,796 A | 5/1993 | Wong et al. | |
| 5,223,693 A | 6/1993 | Zumoto et al. | |

(Continued)

FOREIGN PATENT DOCUMENTS

DE 25 58 788 7/1976

(Continued)

OTHER PUBLICATIONS

Boisset, Buillaume, Calculation results from luxpop.com regarding thin film and index of refraction, www.luxpop.com. Accessed Jan. 31, 2008, (2 pages).

(Continued)

Primary Examiner — Glen Kao
(74) Attorney, Agent, or Firm — Lipsitz & McAllister, LLC

(57) ABSTRACT

An exposure apparatus for producing exposed structures in a photosensitive layer arranged on an object is provided. An object carrier and an exposure device, which can be moved relative to one another in an advance direction, enable exposure spots to be produced on the photosensitive layer in a position-controlled manner. The exposure device has at least one exposure unit with a series of radiation exit regions which are arranged successively in a series direction and from which exposure beams emerge, by means of each of which, passed through an imaging optical system, an exposure spot can be produced on the photosensitive layer and each of which can be deflected by a deflection unit in a deflection direction running transversely to the series direction, such that each exposure beam can produce exposure spots that at least partly overlap one another in a multiplicity of successive positions in the deflection direction.

30 Claims, 8 Drawing Sheets

U.S. PATENT DOCUMENTS

| | | |
|---|---|---|
| 5,274,396 A | 12/1993 | Shimoda et al. |
| 5,321,718 A | 6/1994 | Waarts et al. |
| 5,339,737 A | 8/1994 | Lewis et al. |
| 5,343,271 A | 8/1994 | Morishige |
| 5,418,546 A | 5/1995 | Nakagakiuchi et al. |
| 5,475,416 A | 12/1995 | Kessler et al. |
| 5,513,196 A | 4/1996 | Bischel et al. |
| 5,534,950 A | 7/1996 | Hargis et al. |
| 5,561,495 A | 10/1996 | Ishikawa et al. |
| 5,565,742 A | 10/1996 | Shichao et al. |
| 5,579,240 A | 11/1996 | Buus |
| 5,596,339 A | 1/1997 | Furness, III et al. |
| 5,614,961 A | 3/1997 | Gibeau et al. |
| 5,654,817 A | 8/1997 | De Loor |
| 5,674,414 A | 10/1997 | Schweizer |
| 5,739,913 A | 4/1998 | Wallace |
| 5,874,929 A | 2/1999 | Opower et al. |
| 5,892,611 A | 4/1999 | Iizuka |
| 5,936,713 A | 8/1999 | Paufler et al. |
| 6,002,466 A | 12/1999 | Brauch et al. |
| 6,025,864 A | 2/2000 | Nashimoto |
| 6,204,875 B1 | 3/2001 | De Loor et al. |
| 6,225,012 B1 | 5/2001 | Nishi et al. |
| 6,274,288 B1 | 8/2001 | Kewitsch et al. |
| 6,324,250 B1 | 11/2001 | Amemiya et al. |
| 6,368,775 B1 | 4/2002 | Potter, Jr. et al. |
| 6,489,626 B2 | 12/2002 | van der Muehlen et al. |
| 6,586,169 B2 | 7/2003 | Brauch et al. |
| 6,692,894 B1 | 2/2004 | Nakano et al. |
| 6,859,261 B2 | 2/2005 | Opower et al. |
| 7,126,735 B1 | 10/2006 | Kinoshita et al. |
| 7,310,463 B2 | 12/2007 | Shimotsuma et al. |
| 7,363,856 B1 | 4/2008 | Moulin |
| 7,372,478 B2 | 5/2008 | Oshida et al. |
| 7,388,663 B2 | 6/2008 | Gui |
| 7,652,750 B2 | 1/2010 | Opower et al. |
| 7,705,967 B2 | 4/2010 | Opower et al. |
| 2001/0021484 A1 | 9/2001 | Brauch et al. |
| 2002/0015088 A1* | 2/2002 | Inoue et al. ............ 347/238 |
| 2002/0114567 A1 | 8/2002 | Novotny et al. |
| 2002/0141024 A1 | 10/2002 | Retschke et al. |
| 2003/0031365 A1 | 2/2003 | Okuyama |
| 2003/0160948 A1 | 8/2003 | Opower et al. |
| 2003/0162124 A1 | 8/2003 | Akiba et al. |
| 2004/0165056 A1 | 8/2004 | Allen et al. |
| 2004/0240813 A1 | 12/2004 | Koyagi |
| 2004/0241340 A1 | 12/2004 | Sato et al. |
| 2005/0180692 A1 | 8/2005 | Ishikawa et al. |
| 2005/0219496 A1 | 10/2005 | Oshida et al. |
| 2006/0092419 A1 | 5/2006 | Gui |
| 2006/0170893 A1 | 8/2006 | Opower et al. |
| 2006/0244943 A1 | 11/2006 | Opower et al. |
| 2007/0236695 A1 | 10/2007 | Sjostrom |
| 2008/0213705 A1 | 9/2008 | Oshida et al. |
| 2010/0030347 A1 | 2/2010 | Shindo |

FOREIGN PATENT DOCUMENTS

| | | |
|---|---|---|
| DE | 31 18 802 | 2/1982 |
| DE | 36 24 163 | 1/1987 |
| DE | 35 29 571 | 2/1987 |
| DE | 41 06 423 | 10/1991 |
| DE | 40 22 732 | 2/1992 |
| DE | 43 13 111 | 10/1994 |
| DE | 44 26 107 | 2/1995 |
| DE | 195 21 390 | 2/1996 |
| DE | 195 34 165 | 5/1996 |
| DE | 195 22 936 | 1/1997 |
| DE | 195 29 656 | 2/1997 |
| DE | 693 27 425 | 6/2000 |
| DE | 695 19 221 | 6/2001 |
| DE | 103 46 201 | 4/2005 |
| DE | 10 2005 011 339 | 10/2005 |
| DE | 10 2006 008 075 | 10/2006 |
| EP | 0 467 076 | 1/1992 |
| EP | 0 573 375 | 12/1993 |
| EP | 0 587 228 | 3/1994 |
| EP | 0 655 707 | 5/1995 |
| EP | 0 683 595 | 11/1995 |
| EP | 0 729 265 | 8/1996 |
| EP | 1 319 984 | 6/2003 |
| EP | 1 653 288 | 5/2006 |
| GB | 1 538 233 | 1/1979 |
| JP | 58033753 | 2/1983 |
| JP | 4025290 | 1/1992 |
| JP | 2006294954 | 10/2006 |
| WO | WO 93/24326 | 12/1993 |
| WO | WO 98/00760 | 1/1998 |
| WO | 00/72092 | 11/2000 |
| WO | WO 2008/029609 | 3/2008 |

OTHER PUBLICATIONS

Kewitsch, Anthony S. and Yariv, Amnon (Jan. 22, 1996). "Nonlinear optical properties of photoresists for projection lithography." Applied Physics Letters, 68 (4). pp. 455-457.

Rostami et al., "A Proposal for High Resolution Photolithography Using Optical Limiters", Laser Phys. Lett. 1, No. 9, pp. 462-467, 2004.

*Patent Abstracts of Japan*, vol. 2000, No. 20, Publication No. 2001066783, Material for Forming Fine Pattern, and Fine Pattern Forming Method Using the Same, U.S. Appl. No. 11/242,778, Mar. 16, 2001.

Misawa, et al, "Microfabrication by Femtosecond Laser Irradiation", Proceedings of SPIE, vol. 3933, pp. 246-260 (2000).

*Patent Abstracts of Japan*, Publication No. 2001319382, "Exposure Device of Master Disk for Optical Recording Medium, Exposure Method of Master Disk for Optical Recording Medium, Optical Pickup and Optical Recording Method", application No. 2000134815, Nov. 16, 2001.

* cited by examiner

EXPOSURE APPARATUS

This application is a continuation of International application No. PCT/EP2007/010648 filed on Dec. 7, 2007.

This patent application claims the benefit of International application No. PCT/EP2007/010648 of Dec. 7, 2007 and German application No. 10 2006 059 818.0 of Dec. 11, 2006, the teachings and disclosure of which are hereby incorporated in their entirety by reference thereto.

BACKGROUND OF THE INVENTION

The invention relates to an exposure apparatus for producing exposed structures in a photosensitive layer disposed on an object, comprising an object carrier accommodating the object and an exposure device, the object carrier and the exposure device being movable in relation to one another in a direction of advance and it being possible for exposure spots to be produced by the exposure device on the photosensitive layer in a position-controlled manner, transversely with respect to the direction of advance.

Such exposure apparatuses are known from the prior art, the object of these exposure apparatuses being to expose the photosensitive layer with the highest possible precision.

On the basis of these known solutions, it is an object of the present invention to improve an exposure apparatus of the generic type in such a way that an exposure power that is as high as possible is provided, that is to say as large a number of exposure spots as possible can be produced per unit of time.

SUMMARY OF THE INVENTION

This object is achieved according to the invention in the case of an exposure apparatus of the type described at the beginning by the exposure device having at least one exposure unit with a series of radiation exit regions which are disposed successively in a series direction and from which exposure beams emerge, with each of which beams, directed through an imaging optical system, an exposure spot can be produced on the photosensitive layer and each of which beams can be deflected by a deflection unit in a direction of deflection running transversely with respect to the series direction such that each exposure beam can be used to produce exposure spots that at least partly overlap one another in a multiplicity of successive exposure spot positions in the direction of deflection.

The advantage of the solution according to the invention can be seen in that it allows such an exposure apparatus to simultaneously produce a high number of exposure spots, the position of which can be defined on the one hand by the deflection unit and on the other hand by the movement in the direction of advance.

In the case of this solution, it is particularly advantageous if the direction of deflection runs at an angle with respect to the direction of advance, so that there is the possibility of simultaneously exposing exposure spots lying next to one another transversely with respect to the direction of advance by the various exposure beams of the at least one exposure unit, in spite of the direction of deflection running transversely with respect to the series direction.

It is particularly advantageous, furthermore, if the exposure spots of successive exposure beams of the at least one exposure unit are movable along directions of deflection that are parallel to one another, since easy simultaneous positioning of the exposure spots that can be produced by the various exposure beams can be realized in this way.

Furthermore, it is advantageous if the exposure beams of the at least one exposure unit can be deflected simultaneously and to the same extent by the deflection unit, so that, as a result, the positioning of the exposure spots produced by these exposure beams is made easier, since the relative position of the exposure spots is fixed in a defined manner for a control unit.

In order also to influence the photochemical processes in the photosensitive layer as far as possible to the same extent and obtain photochemical conversion processes that are as identical as possible in the case of all the exposure beams, it is advantageously provided that the exposure beams of an exposure unit are aligned substantially parallel to one another when they impinge on the photosensitive layer, so that the alignment of the exposure beams cannot cause different effects.

Furthermore, it is advantageous if the movement of each exposure spot produced by an exposure beam in the respective direction of deflection takes place over a path of deflection which is approximately the same size for each exposure beam of the exposure unit. This allows the positioning of the exposure spots to be fixed and carried out by means of the control unit in a simple way.

In order to achieve the effect that the exposure spots produced by different exposure beams can be positioned in such a way that contiguous structures, in particular with a component in a transverse direction, can be produced with the exposure spots provided by different exposure beams, it is preferably provided that the exposure spot of the final exposure spot position of one path of deflection and the exposure spot of the first exposure spot position of the next path of deflection following in the series direction are disposed in such a way with respect to a straight reference line running parallel to the direction of advance that the straight reference line intersects the exposure spots produced in these exposure spot positions.

It is ensured by this provision that the exposure spots of the final exposure spot position of one exposure beam and of the first exposure spot position of the next exposure beam following in the series direction are disposed in relation to one another transversely with respect to the direction of advance such that, with suitable displacement in the direction of advance, they overlap at least slightly.

It is particularly advantageous if a straight reference line running parallel to the direction of advance through the final exposure spot position of one path of deflection intersects the exposure spot of a first exposure spot position of a next-following path of deflection.

If it is assumed that a center point of the respective exposure spot is to be taken as the exposure spot position, it is ensured by this provision that, with suitable displacement in the direction of advance, the two exposure spots overlap by approximately at least half, a provision which is advantageous whenever a contiguous structure is to be produced in the photosensitive layer by way of the exposure spots of different paths of deflection.

It is still more advantageous if the first exposure spot position of the next-following path of deflection is at a distance from the straight reference line that corresponds at most to half the diameter of the exposure spot, so that the overlapping of the two exposure spots is still greater, that is to say at least half the diameter, but usually more than that.

In order to be able within the scope of the solution according to the invention to produce as many exposure spots as possible simultaneously, it is preferably provided that a plurality of exposure units are provided, the exposure units being disposed at a distance from one another in the direction of deflection.

Furthermore, with such a plurality of exposure units, it is provided that the deflecting directions of the plurality of exposure units run parallel to one another, so that as a result the establishment of the individual exposure spot positions for the control unit can be carried out more easily and efficiently.

The plurality of exposure units could be disposed in relation to one another in such a way that the series directions of successive exposure units run transversely with respect to one another.

Furthermore, in the case of an exemplary embodiment, it is provided that the series direction of the plurality of exposure units run substantially parallel to one another, so that ultimately the individual series in the plurality of exposure units are also aligned substantially parallel to one another.

In order even in the case of a plurality of exposure units to be able to produce contiguous structures with the exposure spots that can be produced by them, it is provided that the plurality of exposure units are disposed with respect to a straight reference line running parallel to the direction of advance in such a way that the straight reference line intersects the exposure spot of the final exposure spot position of the final deflecting path of one exposure unit and the exposure spot of the first exposure spot position of the first exposure spots of the next exposure unit following in the direction of deflection or in the transverse direction. Also as a result, at least a slight overlapping of the two exposure spots is ensured, in order to be able to produce, with the exposure spots of different exposure units, contiguous structures which run with at least one component in the transverse direction.

However, the overlapping is even better if the straight reference line running through the final exposure spot position of a final deflecting path of one exposure unit intersects the exposure spot of the first exposure spot position of a first deflecting path of a next following exposure unit in the direction of deflection or transverse direction, so that, on the basis of the fact that the exposure spot position is defined by the center point of the respective exposure spot, the two exposure spots overlap by at least approximately half.

A further provision that is suitable for the overlapping provides that the first exposure spot position is at a distance from the straight reference line that corresponds at most to half the diameter of the exposure spot of the first exposure spot position.

With regard to the deflection units, no further details have been specified so far.

Within the scope of the solution according to the invention, it would in principle be conceivable to provide each exposure beam with its own dedicated deflection unit, in which case the deflection units could also operate differently.

As a solution that is advantageous for reasons concerning the production of an exposure apparatus of this kind, it is provided that the deflection unit has a reflective surface region for each of the exposure beams.

In this case, the individual reflective surface regions may still be movable independently of one another. For reasons of structural unity, however, it is advantageous if the reflective surface regions of an exposure unit are jointly movable.

The reflective surface regions can be realized particularly advantageously if the reflective surface regions are partial regions of a common reflective surface.

In order to achieve a deflection with these reflective surface regions, it is advantageous if the reflective surface regions can be tilted in relation to the direction of impingement of the exposure beams on these regions, since such a tilting movement of the reflective surface regions can be mechanically realized in a simple way.

In principle, the reflective surface regions may be curved, in order, for example, also to simultaneously carry out focusing with them, but a solution in which the reflective surface regions are planar surface regions is structurally particularly simple.

It is structurally particularly advantageous if all the reflective surface regions lie in a common plane, which makes it easier to carry out the tilting movement.

In the case of this solution, it is advantageous in particular to dispose the reflective surface regions in such a way that the reflective surface regions on which the exposure beams of an exposure unit impinge lie in the same plane.

In order to achieve a deflection of the respective exposure beam that is as efficient as possible, it is provided that the exposure unit has a plurality of reflective surface regions for each exposure beam.

In this case, it is particularly advantageous if the deflection unit has for each exposure beam a plurality of reflective surface regions that are used one after the other for deflecting the exposure beam, so that each exposure beam is deflected by a multiplicity of reflective surface regions that are used one after the other.

Such a number of reflective surface regions can be realized in a structurally simple manner if the plurality of reflective surface regions are formed by circumferential sides of a rotatably disposed reflective body.

The reflective body could in this case still be able to tilt about an axis in an oscillating manner.

However, to achieve a deflecting speed that is as high as possible, it is particularly advantageous if the reflective body is disposed such that it rotates about an axis.

In this case, the reflective surface regions are suitably disposed around the axis at the same radial distance, the reflective surface regions preferably extending parallel to the axis.

In this case, the reflective surface regions could also have curved reflective surfaces, which, however, run parallel to the axis in spite of the curvature.

In order to be able to assign the position of the reflective surfaces in a defined manner to the respectively corresponding exposure spot positions, it is preferably provided that the reflective body rotates about its axis at a constant speed.

Within the scope of the solution according to the invention, no further details have been specified as to how the exposure beams emerging from the radiation exit regions are to be produced. For example, the radiation exit regions could actually be exit regions of radiation sources, for example laser diodes.

It is still more advantageous, however, if the radiation exit regions are ends of optical fibers.

This provides the possibility of disposing the radiation regions and the radiation sources separately from one another.

In order, however, to be able to control the intensity specifically in each individual radiation region, it is provided that each optical fiber has its own dedicated radiation source, so that the intensity emerging from the radiation exit regions can be controlled by the intensity control of this radiation source, whether by intensity control of the radiation source itself or of a downstream intensity control element.

Likewise preferably provided in this case as a radiation source is a laser, which for reasons of simple construction is preferably a semiconductor laser.

It is particularly advantageous in this case if the radiation sources are disposed in a radiation generating unit located separately from the exposure device, since there is then the possibility of efficiently cooling the radiation sources and, in particular, there is no risk of thermal problems with regard to the accuracy of the exposure spot positions that can be produced by the exposure device being caused by the heat generated by the radiation sources.

Further features and advantages of the solution according to the invention are the subject of the following description and the pictorial representation of an exemplary embodiment.

DETAILED DESCRIPTION OF THE INVENTION

Figure 1:
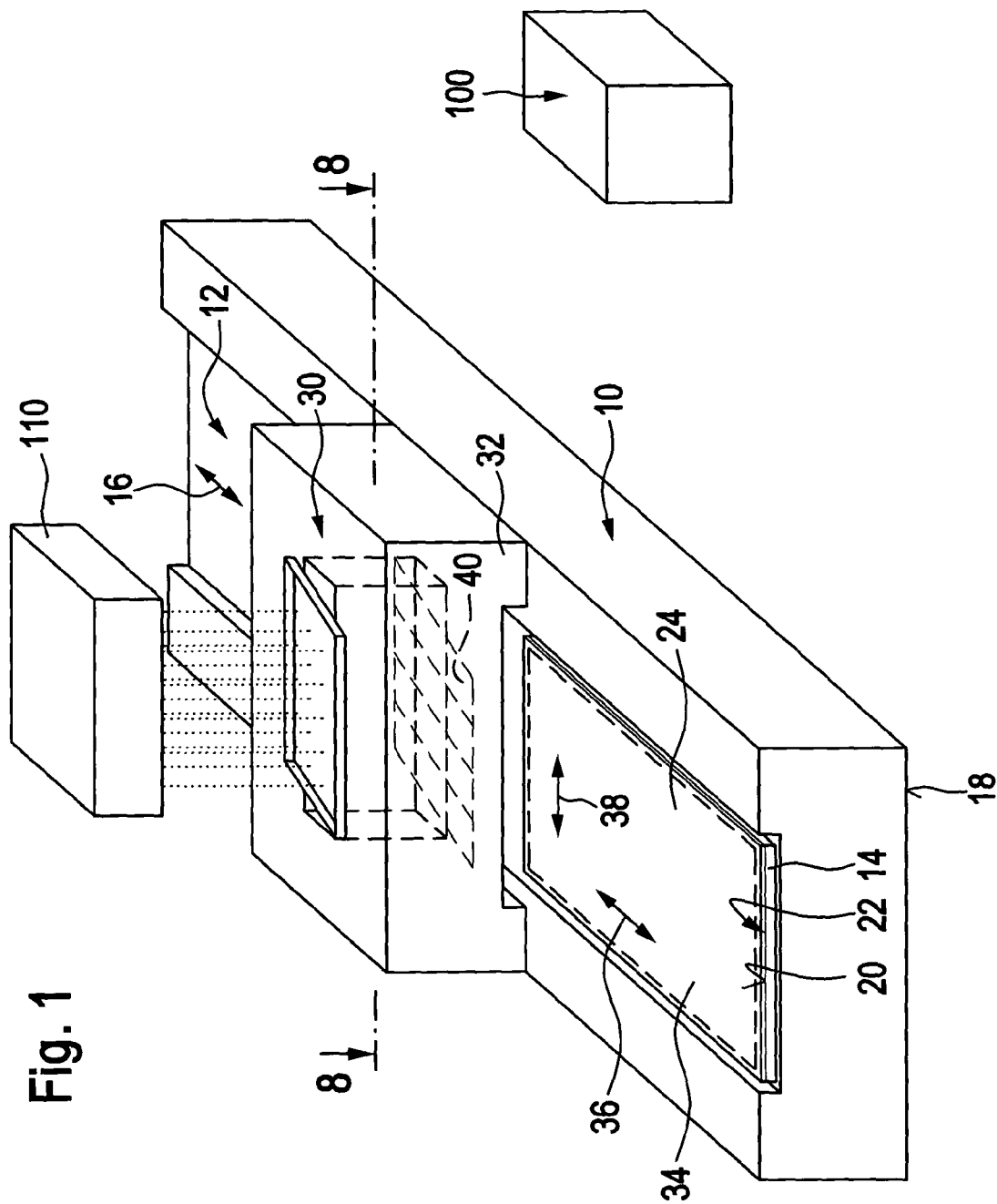
FIG. 1 shows a schematic perspective representation of an exemplary embodiment of an exposure apparatus according to the invention.

An exemplary embodiment of an exposure device represented in FIG. 1 comprises a machine base, which is designated as a whole by 10 and has a guide 12, on which an object carrier 14 is on the one hand movably guided in the direction of a direction of advance 16 and on the other hand is movable by drives, for example linear drives, preferably in a positionally precise manner.

Figure 2:
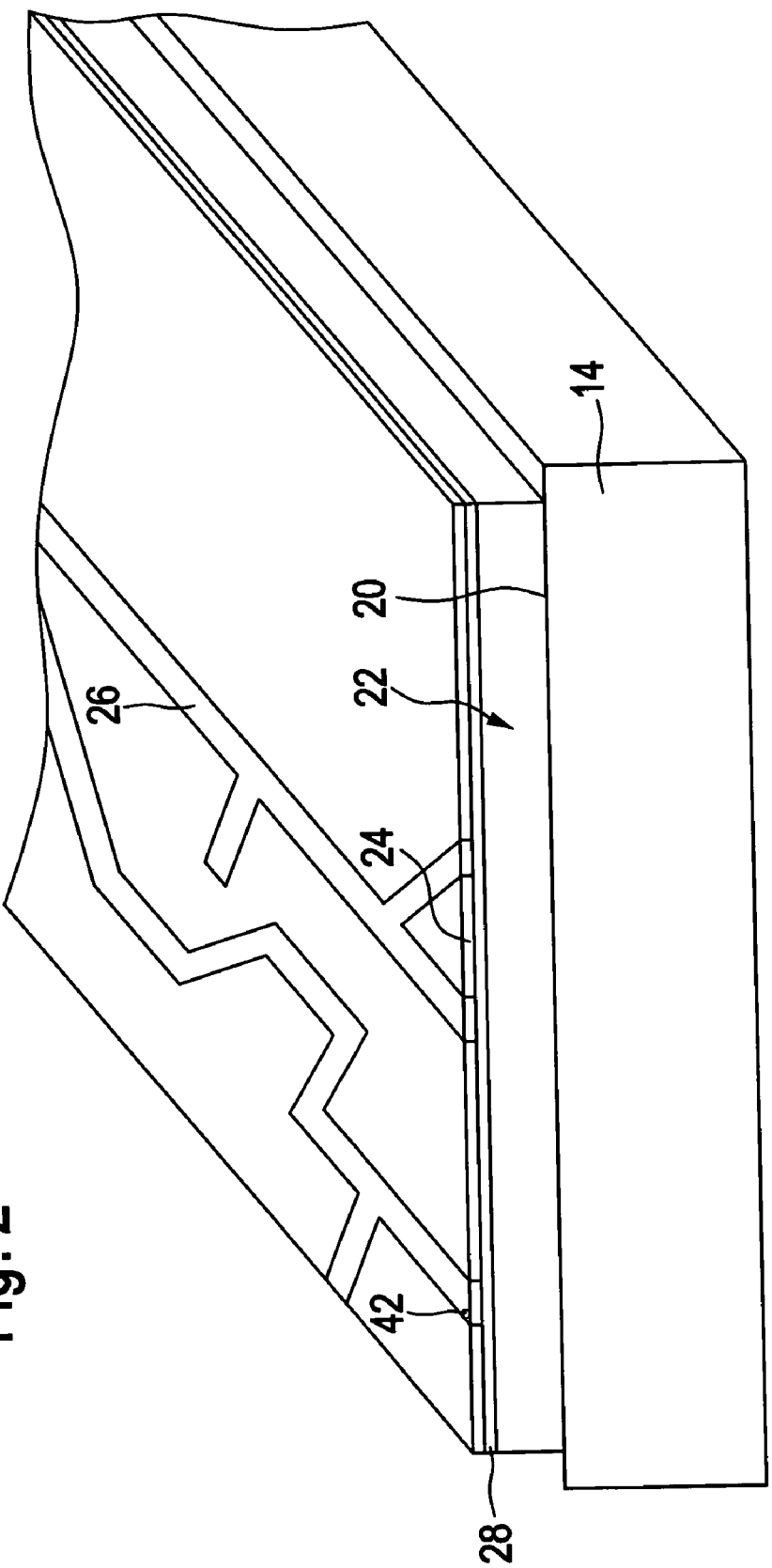
FIG. 2 shows an enlarged representation of a detail of an object with a photosensitive layer and structures possibly to be produced therein, disposed on an object carrier.

The guide 12 is in this case disposed, for example, on a side of the machine base 10 that is facing away from a standing surface 18 and guides the object carrier 14 in such a way that, as represented in FIG. 2, an object 22 can be placed and fixed on its upper side 20, that faces away from the machine base 10, which object is provided on its side that is once again facing away from the object carrier 14 with a photosensitive layer 24, in which structures 26 can be produced by suitable exposure, as a result of optical transformation of the material of the photosensitive layer 24.

Such structures 26 serve, for example, for selectively masking individual regions of a layer 28, for example a copper layer 28, of the object 22, in order then, for example in the process of an etching operation, to remove the layer 28 at the locations at which it is not masked by the structures 26, so that the layer 28 only remains in the regions in which it is masked by the structures 26.

Producing the structures 26 represented in FIG. 2 by optical transformation of the photosensitive layer 24 takes place by an exposure device, which is designated as a whole by 30 and is disposed on a bridge 32, which is supported on both sides of the guide 12 on the machine base 10 and otherwise extends above the guide 12.

In the case of the exemplary embodiment represented, it is possible with the exposure device 30 according to the invention, by a single movement of the object carrier 14 with the object 22 with the photosensitive layer 24, to produce, by exposure, within a structure region 34, all the structures 26 intended in this structure region 34 in the course of a single movement of the photosensitive layer 24 in the direction of advance, the exposure device 30 being capable in the course of the single movement of the photosensitive layer 24 in the direction of advance 16 to expose the structure region 34 both in its longitudinal direction 36 and in its transverse direction 38 in one go, in order to produce all the structures 26 intended and required within the structure region 34 without requiring further movements of the object carrier 14 in the direction of advance 16.

However, in the case of a modification of the first exemplary embodiment, it is conceivable to move the object carrier 14 once in a direction of the direction of advance 16 and another time in the opposite direction, so that, starting from a starting position represented in FIG. 1, a back and forth movement of the object carrier 14 leads to the desired comprehensive exposure in the structure region 34, so that it would be conceivable, for example, to expose half the structure region 34, seen in the transverse direction 38, in the course of a movement in a direction of the direction of advance 16 and, if appropriate, the other half in the opposite direction.

Figure 3:
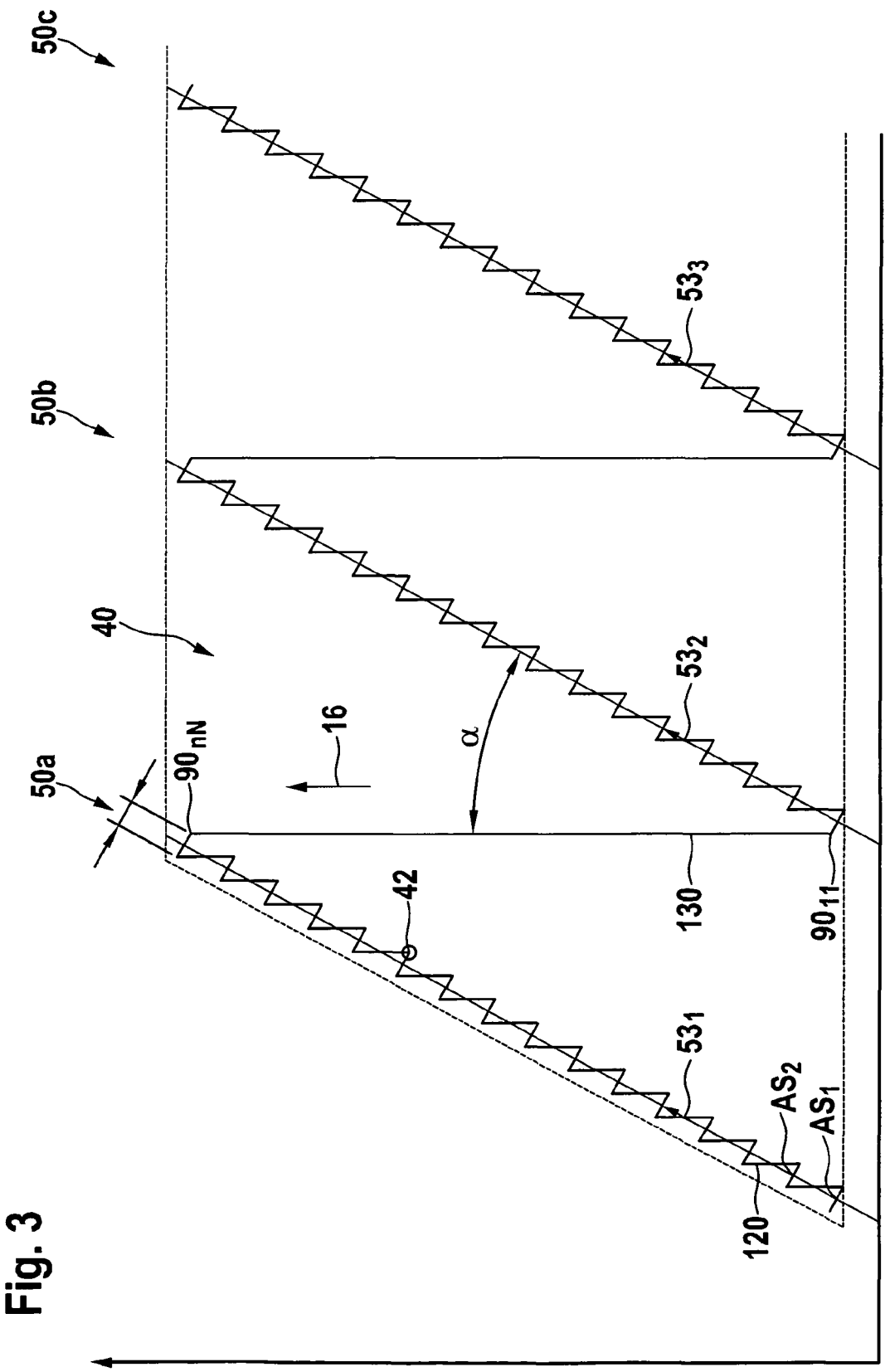
FIG. 3 shows a schematic representation of a detail of a partial region of an exposure region in which exposure spots can be produced.

In order to be able to produce all the required structures 26 within this structure region 34, it is possible to produce within an exposure region 40, represented in FIG. 1 and partly in FIG. 3, individual exposure spots 42 which are disposed within the exposure region 40 in such a way that the sum of all the exposure spots 42 present in the exposure region 40 comprises all those exposure spots 42 that are required to produce, in the transverse direction 38, a linear structure that extends over the entire extent of the structure region 34 in the transverse direction 38 and is uninterruptedly continuous in the transverse direction 38, for which purpose the exposure spots 42 are to be disposed in such a way that they overlap exposure spots 42 successively following one another in the transverse direction 38.

That is to say in other words that the exposure spots 42 that can be produced within the exposure region 40 are of such a size and are disposed in such a way that, taking into account the movement of the object 22 in the direction of advance 16, they can be used to produce all possible structures 26 over the whole area in the entire structure region 34 of the photosensitive layer 24 in the process of the resolution that is caused by the areal extent of the exposure spots 42 in the longitudinal direction 36 and the transverse direction 38.

Figure 4:
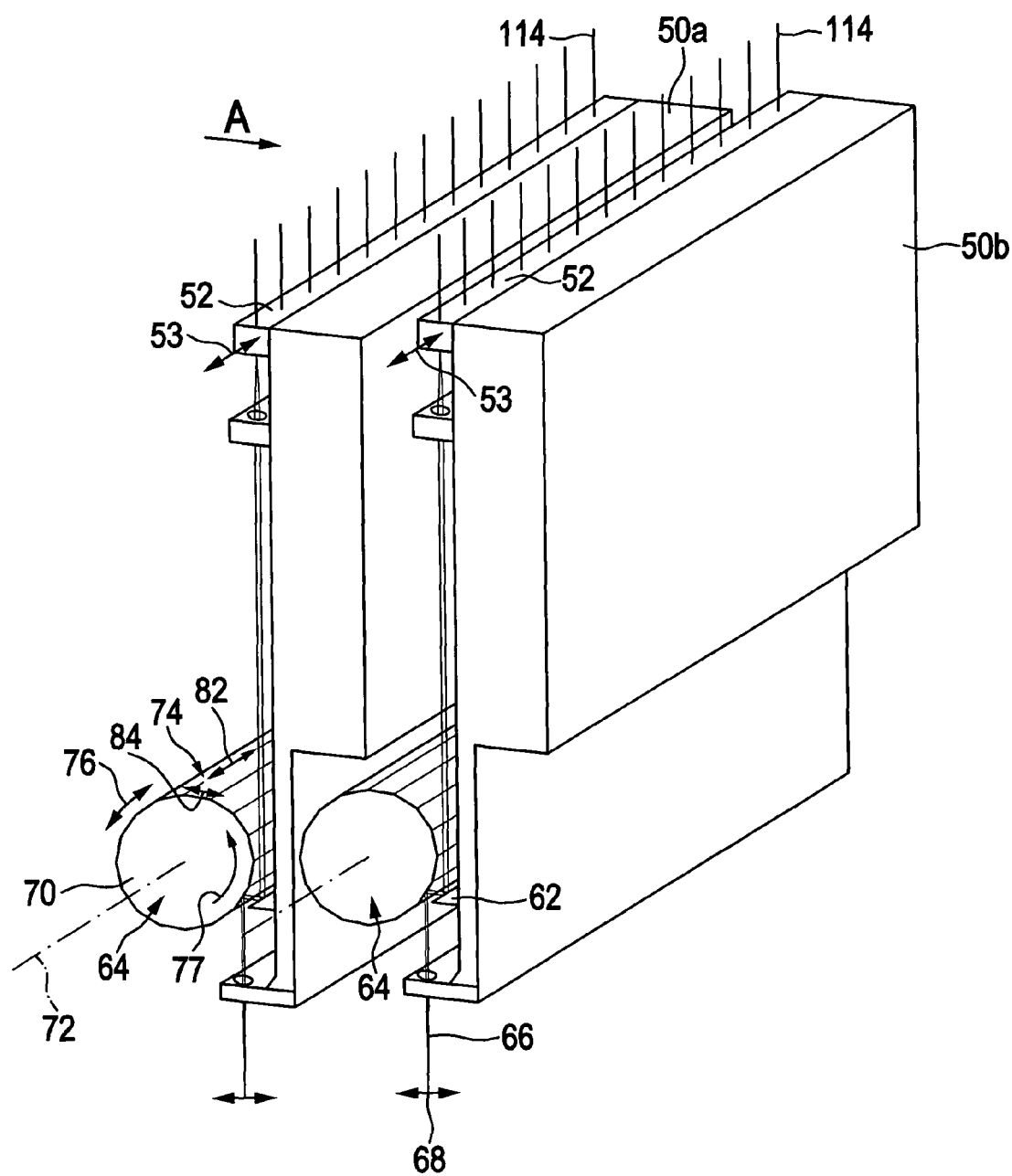
FIG. 4 shows a schematic representation of a detail of two exposure units.
Figure 5:
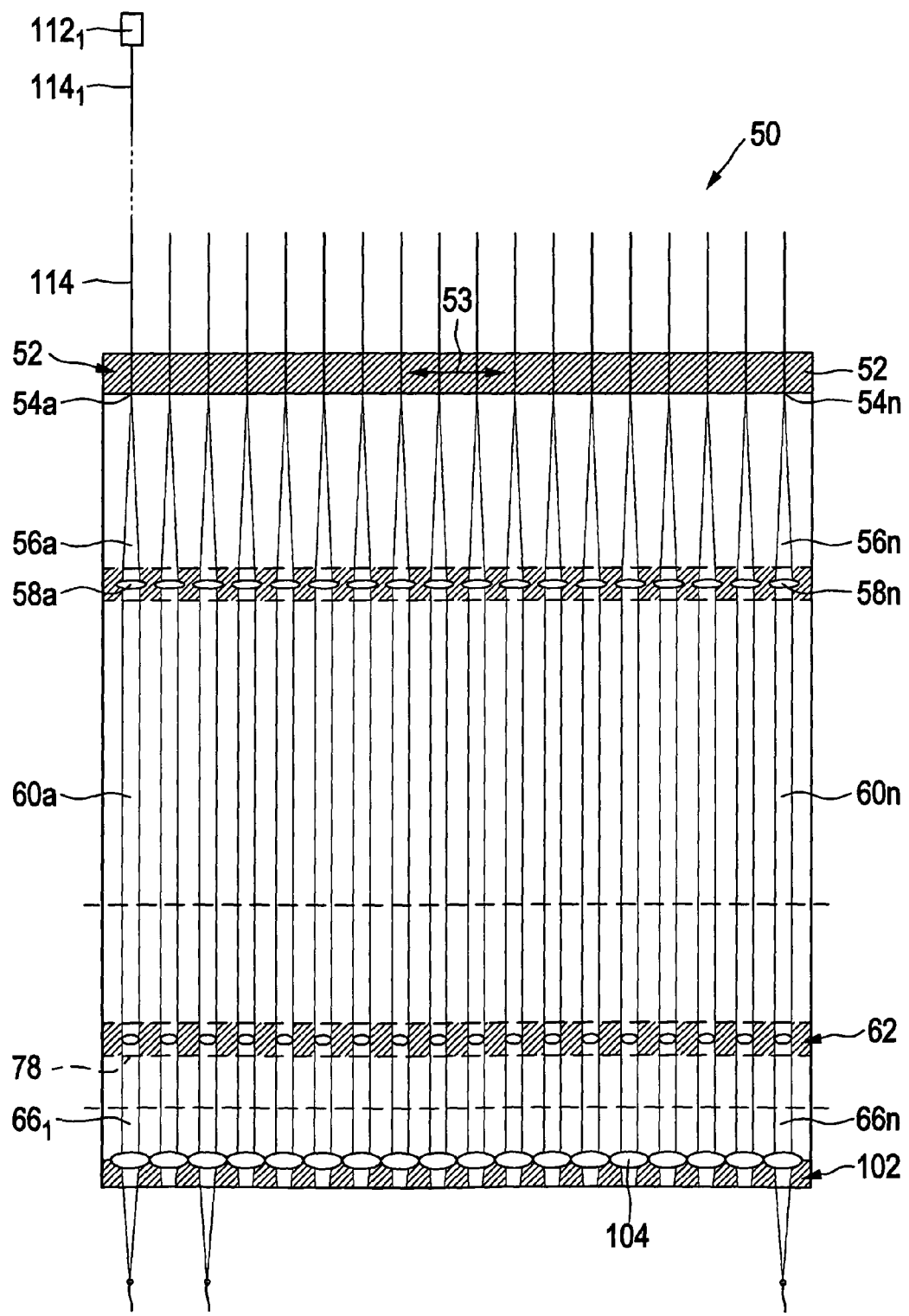
FIG. 5 shows a plan view in the direction of an arrow A of one of the exposure units.

In order to be able to produce the exposure spots 42 in the required number and position within the exposure region 40, provided in the exposure device 30, as represented in FIG. 4, are a number of exposure units 50, each of which has, as represented in FIG. 5, a series of radiation exit regions 54, which are disposed successively in a series direction 53 and at a distance from one another and from which exposure beams 56 respectively emerge, which beams are transformed by optical systems 58 into collimated exposure beams 60, the collimated exposure beams 60 then being deflected, as represented in FIGS. 4 and 5, by a deflection unit 62, transversely with respect to their direction of propagation, and thereby impinging on a deflection unit 64, which is represented in FIG. 4 and, as represented in FIG. 4, deflects the collimated exposure beams 60 into exposure beams 66 moving in a direction of deflection 68 transversely with respect to a direction 53.

The deflection unit 64 comprises a reflective body 70, which is disposed symmetrically with respect to an axis 72 and has reflective surfaces 74, which extend parallel to the axis 72 and are preferably disposed on the circumferential surface of the reflective body 70.

The reflective surfaces 74 preferably substantially border one another in the circumferential direction 76 and extend over the same length or width in their longitudinal direction 82 and in their transverse direction 84, so that all the reflective surfaces 74 have the same extent.

In addition, all the reflective surfaces 74 are planar surfaces, so that, in the simplest case, the reflective body 70 has a cross-sectional area which is a regular polygon, the number of reflective surfaces 74 being, for example, greater than 4 and less than 40.

A preferred embodiment provides that the number of reflective surfaces 74 is greater than 12 and less than 30.

Figure 6:
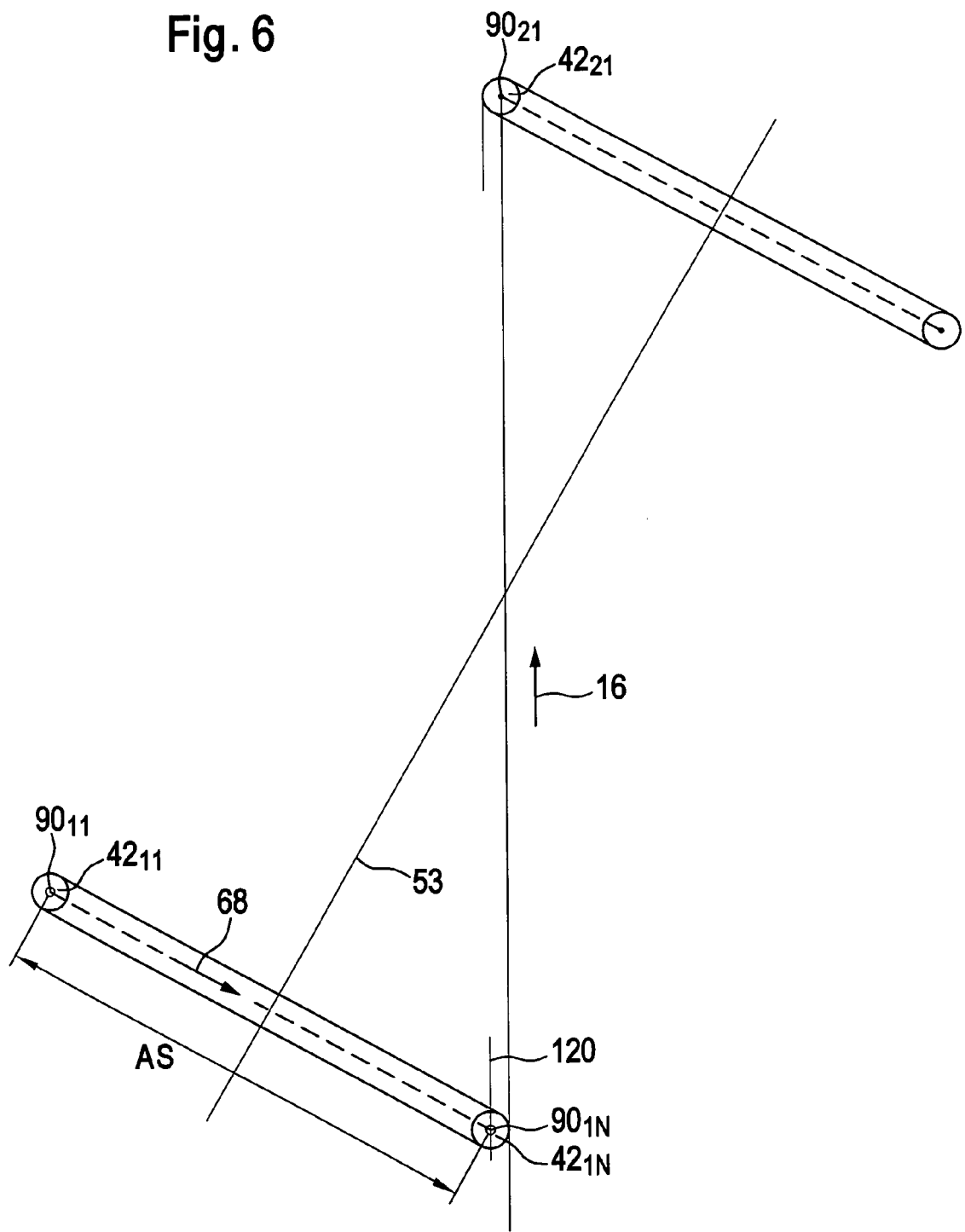
FIG. 6 shows an enlarged representation of a detail of exposure spot positions and exposure spots that can be produced by two exposure beams.
Figure 7:
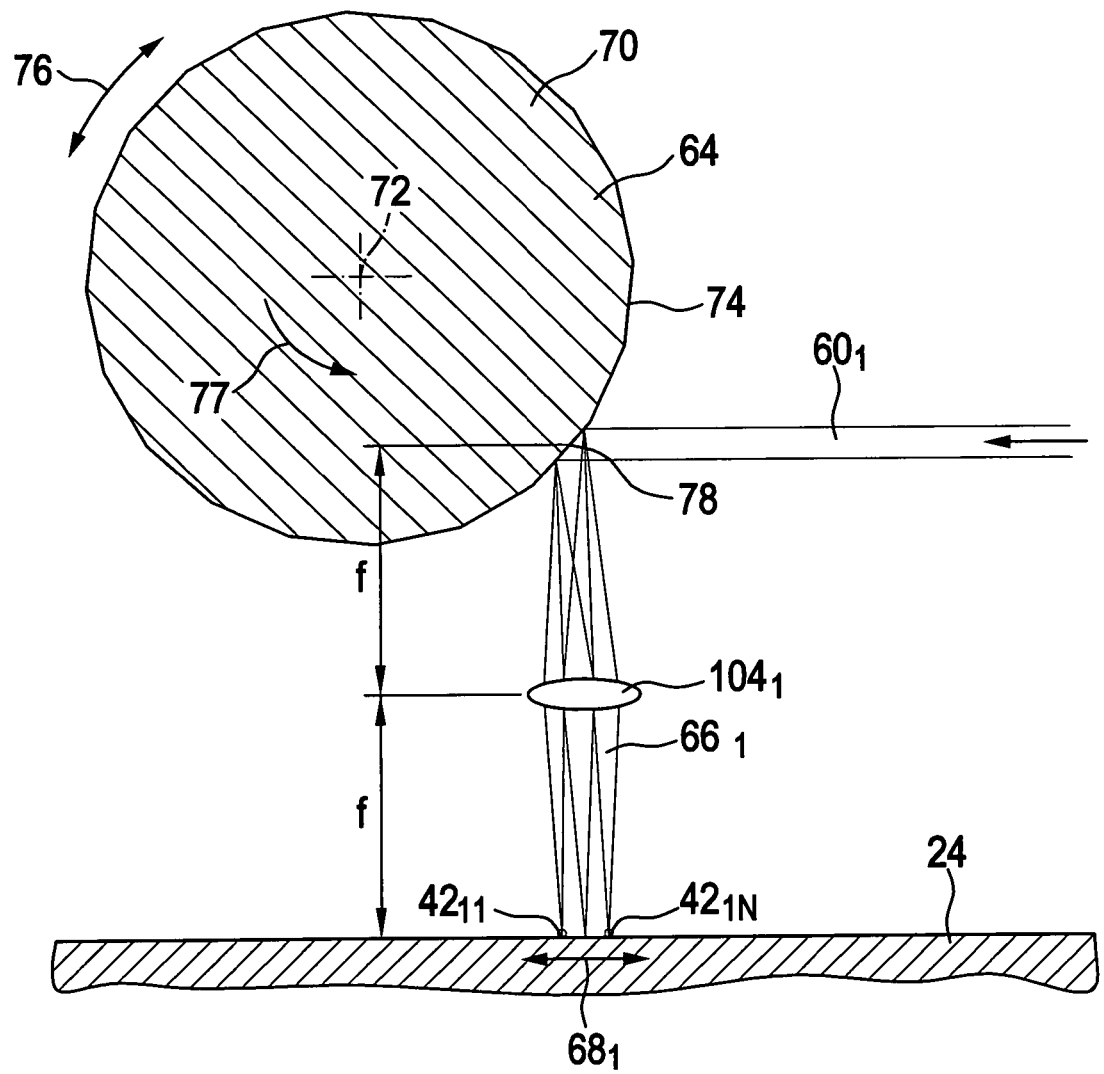
FIG. 7 shows a schematic enlarged representation of the movement of an exposure beam in the direction of deflection and FIG. 8 shows a schematic enlarged representation, in a section along line 8-8 in FIG. 1, of exposure units of the exposure device that are disposed next to one another.

Each of the reflective surfaces 74 reflects with in each case one reflective surface region 78 in each case one collimated exposure beam 60, deflected by the deflection unit 62, in a manner corresponding to the respective rotational position of the reflective body 70, in such a way that, as represented in FIGS. 6 and 7, in a first position of the reflective surface 74, the moving exposure beam $66_1$ produces an exposure spot $42_{11}$, in a first exposure spot position $90_{11}$, which can then move further in the direction of the deflecting direction 68 over a path of deflection AS, to a final exposure spot position $90_{1N}$, which corresponds to the position of the respective reflective surface 74 in which the exposure beam $60_1$ still impinges on it and consequently still serves for producing the exposure spot $42_{1N}$ that is associated with the final exposure spot position $90_{1N}$.

Further turning of the reflective body 70 in the direction of rotation 77 then has the effect that the exposure beam $60_1$ impinges on the next reflective surface 74, which then once again reflects the exposure beam $60_1$ into the moving exposure beam $66_1$ in such a way that the latter in turn produces the exposure spot $42_{11}$, in the first exposure spot position $90_{11}$.

Consequently, the constant rotation of the reflective body 70 about the axis 72 leads to a constant travelling movement of the exposure spots $42_1$ from the first exposure spot position $90_{11}$ to the final exposure spot position $90_{1N}$ over the paths of deflection AS on the photosensitive layer 24.

This provides the possibility of carrying out an exposure of the photosensitive layer 24 in the region of the path of deflection AS along the direction of deflection 68 by the exposure spots $42_1$ in exposure spot positions $90_1$ that can be chosen in a defined manner, to be precise when the respective exposure spot 42 is in the respective exposure spot position $90_1$, it only being possible in this position that an exposure with adequate intensity takes place on the photosensitive layer 24, by activating the respective exposure beam $66_1$, that is to say for example switching on the radiation source associated with the radiation exit $54_1$, an exposure by which a photochemical conversion in the photosensitive layer can be achieved in the region of this exposure spot $42_1$.

If no exposure of the photosensitive layer 24 is intended in the other exposure spot positions $90_1$ within the path of deflection AS, the radiation source associated with the respective radiation exit $54_1$ is not switched on when these exposure spot positions $90_1$ are passed through, or said source is operated with an intensity that cannot lead to photochemical conversion of the photosensitive layer 24 in the region of the respective exposure spot $42_1$.

Figure 8:
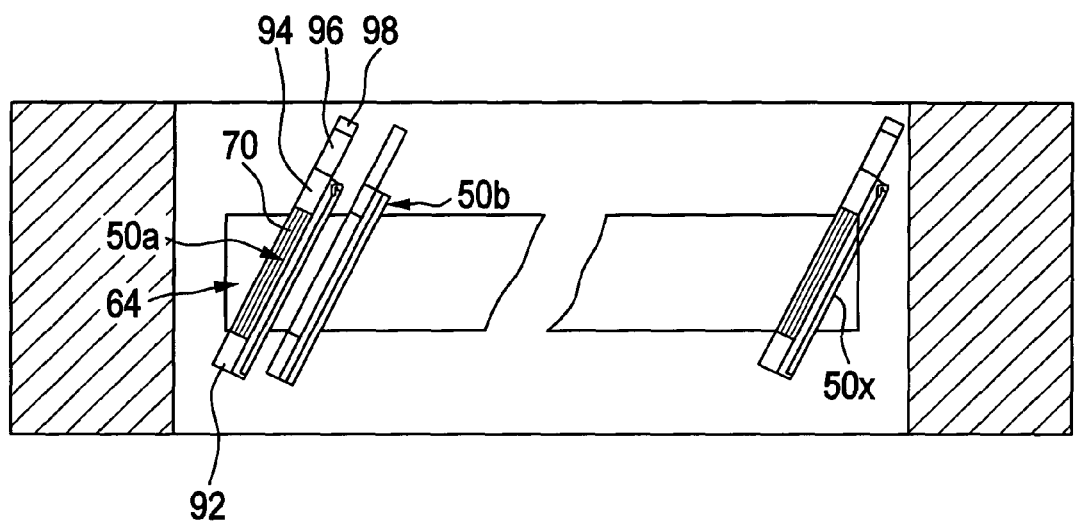

For this purpose, as represented in FIG. 8, the reflective bodies 70 of the deflection units 64 are rotatably mounted about the axis 72 on both sides by bearing devices 92 and 94 and are also driven in rotation at a constant speed by a drive 96, each drive 96 also having an associated sensor 98, which is capable of sensing the rotational position of the reflective body 70, and consequently in particular the position of the reflective surfaces 74, for a control unit that is designated as a whole by 100 and controls the exposure.

For focusing the moving exposure beams 66 onto the photosensitive layer 24, and consequently setting the extent of the exposure spots 42 produced by the respective exposure beams 66, also provided between the deflection unit 64 and the photosensitive layer 24 is an optical unit 102, which has for each of the exposure beams 66 a dedicated optical imaging system 104, for example in the form of a lens, through which the respective moving exposure beam 66 passes and the respective exposure spot 42 is thereby focused onto the photosensitive layer 24 with a defined size of the exposure spot 42 and a defined intensity distribution in the exposure spot 42.

In particular, advantageous imaging properties of the optical imaging system 104 are obtained if the average distance between the active reflective surface region 78 of the reflective surface 74 and the optical imaging system 104 corresponds approximately to the focal length f of the optical imaging system 104, so that the image ratios for the moving exposure beam are substantially identical, and consequently also the exposure spots 42 are of substantially the same size and have substantially the same intensity distribution (FIG. 7).

Furthermore, it is preferably provided that the distance between the optical imaging system 104 and the photosensitive layer 24 to be exposed corresponds approximately to the focal length f of the optical imaging system 104 (FIG. 7), in order to obtain optimum focusing of the respective exposure beam 66 in the exposure spot 42 on the photosensitive layer 24.

With regard to the production of the exposure beams 56, no further details have been specified so far.

A radiation generating unit 110, which comprises a multiplicity of radiation sources 112, for example laser diodes, is preferably provided for producing the exposure beams 56 separately from the exposure device 30, the radiation generated by each of the radiation sources 112 being coupled into a light guide 114, which runs from the radiation generating unit 110 to the exposure device 30 and has an end face which forms the radiation exit region 54, from which the exposure beams 56 emerge.

Locating the radiation generating unit 110 separately from the exposure units 50 has the advantage that this provides the possibility of disposing the radiation sources 112 optimally for their operation and of dissipating the heat generated by them optimally, without this having any accompanying thermal influence on the exposure device 30.

Rather, the exposure device 30 is thermally isolated completely from the radiation generating unit 110, and there is consequently no risk of impairment of the precision in the region of the exposure device 30 being brought about by thermal effects caused by the radiation generating unit 110.

The radiation generating unit 110 may in this case be disposed at a distance above the exposure device 30, but there is also the possibility of disposing the radiation generating unit 110 to the side of the machine base 10, for example alongside the control unit 100, if the light guides 114 are made sufficiently long.

As already explained, for the radiation generating unit 110 there is the possibility on the one hand of exactly sensing the rotational position of the reflective body 70 by way of the respective sensors 98 that are associated with the respective deflection unit 64, and consequently being able to determine in which exposure spot position 90 the respective exposure spot 42 produced is located along the path of deflection AS at the respectively determined point in time, and consequently of deciding whether or not an exposure of the photosensitive layer 24 is to be carried out in this exposure spot position 90, and on the basis of this decision activating the radiation source 112 that is provided for producing the respective exposure spot 42 in such a way that it produces radiation, which triggers a photochemical effect in the photosensitive layer 24 in the region of the exposure spot 42, or switching off said radiation source or reducing its intensity to the extent that no photochemical effect occurs in the region of the exposure spot 42 located in the respective exposure spot position 90.

In order not only to be able to position the individual exposure spots 42 in the individual exposure spot positions 90 within the path of deflection AS in such a way that they overlap one another—for the production of contiguous structures 26 extending at least with a component in the transverse direction—, in order to be able to produce the contiguous structure 26 by a multiplicity of individual exposure spots 42, but also to be able to locate in an overlapping manner the exposure spots 42 that can be produced by exposure beams 66 successively following one another in the series direction 53, the series direction 53 runs at an angle α in relation to the direction of advance 16 such that a straight reference line 120 parallel to the direction of advance 16 and passing through the final exposure spot position $90_{1N}$ of the, for example, first exposure beam $66_1$ of an exposure unit 50 is tangent to, preferably intersects, the exposure spot $42_{21}$ in the first exposure spot position $90_{21}$ of the next exposure beam $66_2$ following in the series direction 53, so that, by movement of the final exposure spot $42_{1N}$ in the direction of advance 16 to the advanced position of the first exposure spot $42_{21}$ of the next-following exposure beam $66_2$, the two exposure spots $42_{1N}$ and $42_{21}$ can be disposed overlapping one another, and consequently the exposure spots $42_2$ of the second exposure beam $66_2$ can also be used together with the exposure spots $42_1$ of the first exposure beam $66_1$ for producing the contiguous structure 26.

This relative disposition of the respectively final exposure spot 42 of an exposure beam 66 with respect to the respectively first exposure spot 42 of the next-following exposure beam 66 is provided in the case of all the exposure beams 66 and exposure spots 42 of an exposure unit 50, so that in theory all the exposure spots 42 of this exposure unit 50 can be used for producing a contiguous structure 26 extending with a component in the transverse direction 38 over the entire extent of this exposure unit 50 in the transverse direction 38.

In the same way as described in conjunction with the disposition of the exposure spots 42 produced by different exposure beams 66, the plurality of exposure units 50a, 50b, 50c etc. are also disposed in relation to one another in such a way that, as represented for example in FIG. 3, a straight reference line 120 that is parallel to the direction of advance 16 and passes through the final exposure position $90_{nN}$ of a first exposure unit, for example the exposure unit 50a, is tangent to, or intersects, the exposure spot $42_{11}$ of the first exposure position $90_{11}$ of the next exposure unit following in the transverse direction 38, for example the exposure unit 50b, so that the exposure spots that can be formed by a plurality of exposure units, for example the exposure units 50a and 50b, can also be used for producing a contiguous structure 26, in that the exposure spots 42 of one exposure unit, for example the exposure unit 50a, are positioned in an overlapping manner and the final exposure spot $42_{nN}$ of the final exposure beam $66_n$ can be disposed in an overlapping manner with the first exposure spot $42_{11}$ of the first exposure beam $66_1$ of the next-following exposure unit, for example the exposure unit 50b, in an overlapping manner.

On condition that the exposure region 40 extends in the transverse direction 38 over the entire width of the photosensitive layer 24, or at least over a region of the photosensitive layer 24 that is intended for exposure and for producing structures 26, contiguous structures or then again non-contiguous structures 26 can be produced in the entire region of the photosensitive layer 24.

Since all the exposure units 50 of the exposure device 30 are disposed in such a way in relation to one another, there is consequently the possibility, by using the advancing movement 16, of producing, on the photosensitive layer 24, over the entire transverse direction 38 thereof and over the entire longitudinal direction 36, structures 26 which are contiguous in any desired regions and may run both in the longitudinal direction 36 and in the transverse direction 38 or at any angle with respect to these directions.

For this purpose, the control unit 100 senses both the position of the photosensitive layer 24 in the direction of advance 16, by detecting the position of the object carrier 14, and the positions of the individual producible exposure spots 42 along the path of deflection AS, by the rotational position of the reflective bodies 70, and is consequently capable, by suitable activation of the respective radiation source 112 at the suitable point in time, additionally of generating an exposure spot 42 at any location of the region of the photosensitive layer 24 that is intended for exposure, this preferably taking place by suitable activation of the radiation sources 112 in the course of a single movement of the object carrier 14 in the direction of advance.

For sufficient accuracy when positioning the exposure spots 42 to produce the structures 26, it is advantageous if the speed in the direction of advance 16 is only so great that the exposure spots 42 produced by an exposure beam 66 from two reflective surface regions 78 successively following one another in the circumferential direction 76 are offset with respect to one another by at most half a diameter, still better by at most a quarter or a fifth of a diameter, of the exposure spots 42, that is to say overlap to a considerable extent.

The invention claimed is:

1. Exposure apparatus for producing exposed structures in a photosensitive layer disposed on an object, comprising:
    an object carrier accommodating the object and an exposure device,
    the object carrier and the exposure device being movable in relation to one another in a direction of advance,
    the exposure device being adapted to produce exposure spots on the photosensitive layer in a position-controlled manner, transversely with respect to the direction of advance,
    the exposure device comprising at least one exposure unit with a series of radiation exit regions which are disposed successively in a series direction and from which exposure beams emerge,
    each of the exposure beams, directed through an imaging optical system, producing an exposure spot on the photosensitive layer,
    a deflection unit for deflecting each of the exposure beams in a direction of deflection running transversely with respect to the series direction such that each exposure beam can be used to produce exposure spots that at least partly overlap one another in a multiplicity of successive exposure spot positions in the direction of deflection,
    the direction of deflection running at an angle with respect to the direction of advance, and
    the exposure spot of a final exposure spot position of one path of deflection and the exposure spot of a first exposure spot position of a next-following path of deflection are disposed in such a way with respect to a straight reference line running parallel to the direction of advance that the straight reference line intersects the exposure spots produced in these exposure spot positions.

2. Exposure apparatus according to claim 1, wherein the exposure spots of successive exposure beams are movable along directions of deflection that are parallel to one another.

3. Exposure apparatus according to claim 1, wherein the exposure beams of the at least one exposure unit are deflected simultaneously and to the same extent by the deflection unit.

4. Exposure apparatus according to claim 1, wherein the exposure beams of an exposure unit are aligned substantially parallel to one another when the exposure beams impinge on the photosensitive layer.

5. Exposure apparatus according to claim 1, wherein the movement of each exposure spot produced by an exposure beam in the respective direction of deflection takes place over a path of deflection which is approximately the same size for each exposure beam of the exposure unit.

6. Exposure apparatus according to claim 1, wherein the first exposure spot position of the next-following path of deflection is at a distance from the straight reference line that corresponds at most to half a diameter of the exposure spot.

7. Exposure apparatus according to claim 1, wherein a plurality of exposure units are provided, the exposure units being disposed at a distance from one another in the direction of deflection.

8. Exposure apparatus according to claim 7, wherein the directions of deflection of the plurality of exposure units run substantially parallel to one another.

9. Exposure apparatus according to claim 7, wherein the series directions of the plurality of exposure units run substantially parallel to one another.

10. Exposure apparatus according to claim 7, wherein the plurality of exposure units are disposed in such a way that the straight reference line intersects the exposure spot of the final exposure spot position of the final deflecting path of one exposure unit and the exposure spot of the first exposure spot position of the first deflecting path of a next-following exposure unit.

11. Exposure apparatus according to claim 7, wherein the straight reference line running through the final exposure spot position of a final deflecting path of one exposure unit intersects the exposure spot of the first exposure spot position of the first deflecting path of a next-following exposure unit.

12. Exposure apparatus according to claim 11, wherein the first exposure spot position is at a distance from the straight reference line that corresponds at most to half a diameter of the exposure spot of the first exposure spot position.

13. Exposure apparatus according to claim 1, wherein the deflection unit has a reflective surface region for each of the exposure beams.

14. Exposure apparatus according to claim 13, wherein the reflective surface regions of an exposure unit are jointly movable.

15. Exposure apparatus according to claim 13, wherein the reflective surface regions are partial regions of a common reflective surface.

16. Exposure apparatus according to claim 13, wherein the reflective surface regions are adapted to be tilted in relation to the direction of impingement of the exposure beams on the reflective surface regions.

17. Exposure apparatus according to claim 13, wherein the reflective surface regions are planar surface regions.

18. Exposure apparatus according to claim 17, wherein all the reflective surface regions lie in a common plane.

19. Exposure apparatus according to claim 17 wherein the reflective surface regions on which the exposure beams of an exposure unit impinge lie in the same plane.

20. Exposure apparatus according to claim 19, wherein the plurality of reflective surface regions are formed by circumferential sides of a rotatably disposed reflective body.

21. Exposure apparatus according to claim 20, wherein the reflective body is disposed for rotation about an axis.

22. Exposure apparatus according to claim 21, wherein the reflective surface regions are disposed around the axis at equal radial distances.

23. Exposure apparatus according to claim 21, wherein the reflective body rotates about the axis at a constant speed.

24. Exposure apparatus according to claim 13, wherein the exposure unit has a plurality of reflective surface regions for each exposure beam.

25. Exposure apparatus according to claim 24, wherein the deflection unit has a plurality of reflective surface regions that are used one after the other for each exposure beam.

26. Exposure apparatus according to claim 1, wherein the radiation exit regions are ends of optical fibers.

27. Exposure apparatus according to claim 26, wherein a radiation source is associated with each optical fiber.

28. Exposure apparatus according to claim 27, wherein the radiation source is a laser.

29. Exposure apparatus according to claim 28, wherein the radiation source is a semiconductor laser.

30. Exposure apparatus according to claim 1, wherein radiation sources of the exposure device are disposed in a radiation generating unit located separately from the exposure device.

* * * * *